United States Patent
Naito et al.

(10) Patent No.: US 7,205,482 B2
(45) Date of Patent: Apr. 17, 2007

(54) TAPE CARRIER FOR TAB

(75) Inventors: Toshiki Naito, Ibaraki (JP); Hiroshi Yamazaki, Ibaraki (JP); Toshihiko Omote, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 408 days.

(21) Appl. No.: 10/680,112

(22) Filed: Oct. 8, 2003

(65) Prior Publication Data

US 2005/0230790 A1    Oct. 20, 2005

(30) Foreign Application Priority Data

Oct. 8, 2002    (JP)    ............................ P2002-294787

(51) Int. Cl.
*H05K 1/03*    (2006.01)

(52) U.S. Cl. ............ 174/254; 174/117 F; 174/117 FF; 174/255; 428/192

(58) Field of Classification Search ................ 174/250, 174/254–255, 117 F, 117 FF; 428/192
See application file for complete search history.

(56) References Cited

U.S. PATENT DOCUMENTS

| | | | | |
|---|---|---|---|---|
| 5,001,888 A | * | 3/1991 | Groth | .......................... 53/450 |
| 5,345,039 A | * | 9/1994 | Yamazaki | ................... 174/52.4 |
| 5,507,903 A | * | 4/1996 | Yamamori et al. | ........... 156/229 |
| 5,975,178 A | * | 11/1999 | Otsuka et al. | ............... 156/358 |
| 6,192,579 B1 | * | 2/2001 | Hayashi et al. | ................ 29/846 |
| 6,313,526 B1 | * | 11/2001 | Nakamura | ................... 257/706 |
| 6,320,135 B1 | * | 11/2001 | Saito | ........................... 174/250 |
| 6,633,002 B2 | * | 10/2003 | Atou | ....................... 174/117 F |
| 6,740,966 B2 | * | 5/2004 | Nakamura | ................... 257/701 |
| 6,919,513 B2 | * | 7/2005 | Chung et al. | ................ 174/255 |

FOREIGN PATENT DOCUMENTS

| | | |
|---|---|---|
| JP | 5-29394 A | 2/1993 |
| JP | 5-82591 A | 2/1993 |
| JP | 10-144735 A | 5/1998 |
| JP | 2000-332062 A | 11/2000 |
| JP | 2000-340617 A | 12/2000 |

* cited by examiner

*Primary Examiner*—Cathy F. Lam
(74) *Attorney, Agent, or Firm*—Sughrue Mion, PLLC

(57) ABSTRACT

Electric conductor patterns having inner leads arranged at a pitch of not larger than 60 μm are formed on a front surface of an insulating layer of a tape carrier for TAB. A reinforcing layer of stainless steel foil is formed on a rear surface of the insulating layer so as to be extend along a lengthwise direction at opposite side edge portions in a widthwise direction of the insulating layer. Accordingly, both dimensional accuracy and positional accuracy can be improved at the time of carrying the tape carrier for TAB or at the time of mounting and bonding electronic parts though the insulating layer can be formed so as to be thin.

4 Claims, 4 Drawing Sheets

TAPE CARRIER FOR TAB

BACKGROUND OF THE INVENTION

1. Field of the Invention

The present invention relates to a tape carrier for TAB (hereinafter referred to as TAB tape carrier) and particularly to a TAB tape carrier for mounting electronic parts by a TAB method.

2. Related Art

A TAB tape carrier is widely used for mounting electronic parts such as semiconductor devices by a TAB (Tape Automated Bonding) method.

A demand for reduction in weight, thickness and size of such a TAB tape carrier has been increasing with the advance of the demand for reduction in weight, thickness and size of electronic parts in recent years.

On the other hand, such a TAB tape carrier is generally carried in the condition that sprockets are engaged with feeding holes formed along a lengthwise direction of the TAB tape carrier at opposite end portions in a widthwise direction of the TAB tape carrier so that a predetermined amount of tension is applied to the TAB tape carrier. For this reason, if the TAB tape carrier is formed so as to be too thin, the feeding holes may be broken at the time of carrying the TAB tape carrier or the positions of the feeding holes may be displaced at the time of mounting and bonding electronic parts.

Therefore, for example, JP-A-5-29394, JP-A-2000-332062, and JP-A-2000-340617 have proposed the provision of a sheet of copper foil on a rear surface of an electrically insulating film to reinforce the electrically insulating film in the condition that electric conductor patterns are formed on a front surface of the electrically insulating film.

The demand for reduction in weight, thickness and size and the demand for reduction in size and density of the electric conductor patterns have been increasing in recent years. These demands cannot be satisfied sufficiently by the reinforcing effect of copper foil. To satisfy these demands, greater improvement in dimensional accuracy and positional accuracy has been required at the time of carrying the TAB tape carrier or at the time of mounting and bonding electronic parts.

SUMMARY OF THE INVENTION

The invention is developed upon such circumstances and an object of the invention is to provide a TAB tape carrier in which high-density wiring can be achieved while reduction in weight, thickness and size is attained as well as improvement in dimensional accuracy and positional accuracy in the TAB tape carrier can be achieved at the time of carrying the TAB tape carrier or at the time of mounting and bonding electronic parts.

In order to achieve the object, according to the invention, there is provided a tape carrier for TAB including: an insulating layer; electric conductor patterns formed on a front surface of the insulating layer and each made of a plurality of wires arranged at a predetermined interval; and a reinforcing layer of stainless steel foil formed on a rear surface of the insulating layer so as to be provided along a lengthwise direction of the insulating layer at opposite side edge portions in a widthwise direction of the insulating layer. The wires may be arranged at a predetermined interval of a pitch of not larger than 60 μm.

In the tape carrier for TAB according to the invention, the insulating layer can be formed to have a thickness of not larger than 50 μm.

BRIEF DESCRIPTION OF THE DRAWINGS

FIG. 4A is the step of preparing a reinforcing layer;

FIG. 4B is the step of forming an insulating layer on the reinforcing layer;

FIG. 4C is the step of forming an undercoat on the whole front surface of the insulating layer;

FIG. 4D is the step of forming feeding holes;

FIG. 5A is the step of forming a plating resist on the undercoat;

FIG. 5B is the step of forming an electric conductor pattern by plating on portions of the undercoat layer except portions where the plating resist is formed;

FIG. 5C is the step of removing the plating resist;

FIG. 5D is the step of removing the undercoat on which the plating resist was formed; and FIG. 5E is the step of forming opening portions in the reinforcing layer in positions where the reinforcing layer overlaps the mount portions.

DETAILED DESCRIPTION OF THE PREFERRED EMBODIMENT

Figure 1:
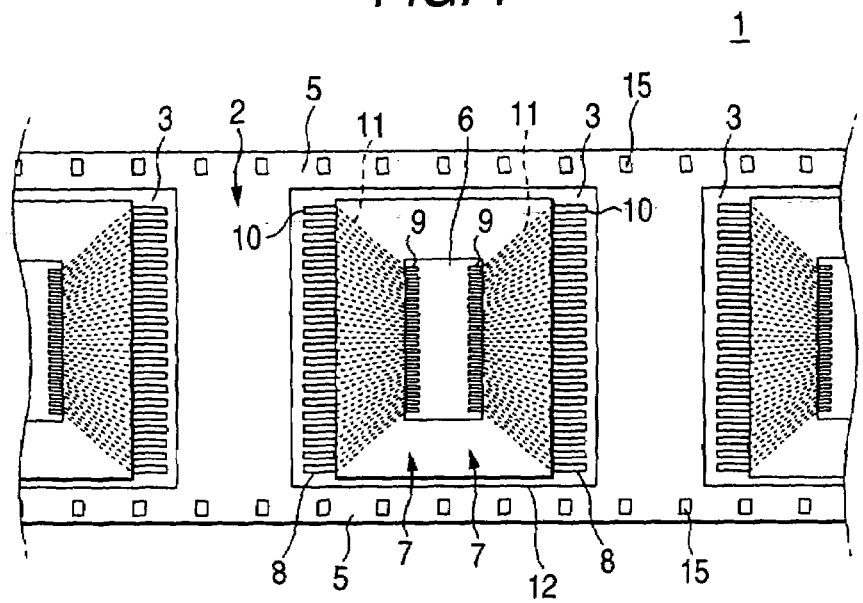
FIG. 1 is a partly plan view showing an embodiment of a TAB tape carrier according to the invention.
Figure 2:
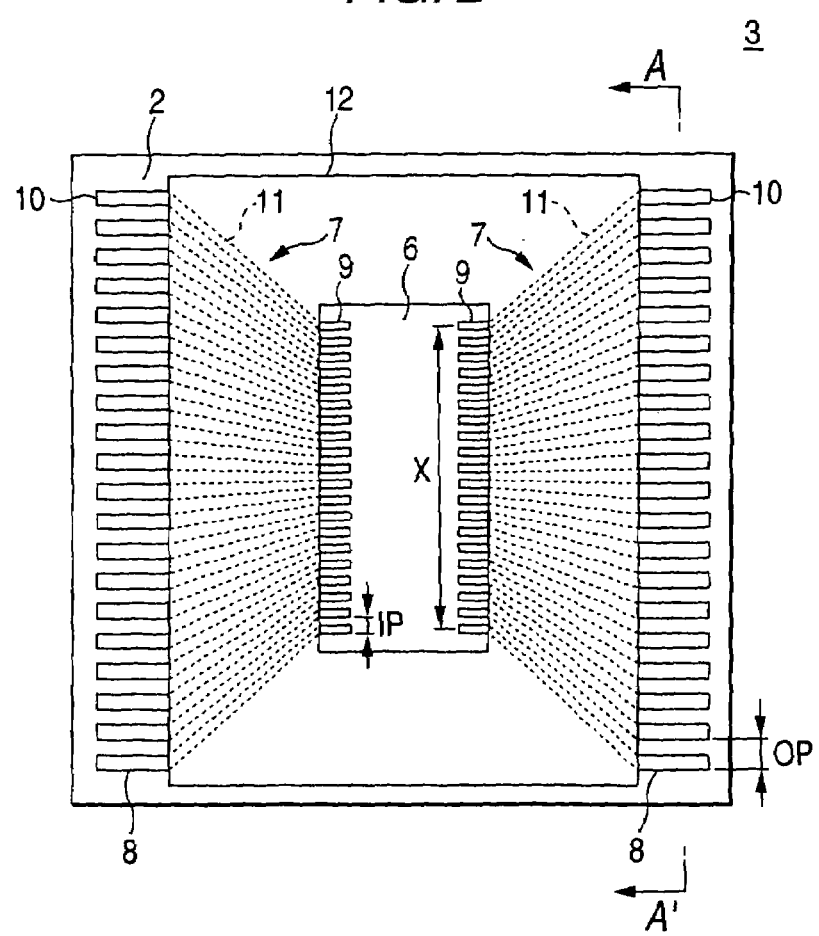
FIG. 2 is a partly enlarged plan view of the TAB tape carrier depicted in FIG. 1.
Figure 3:
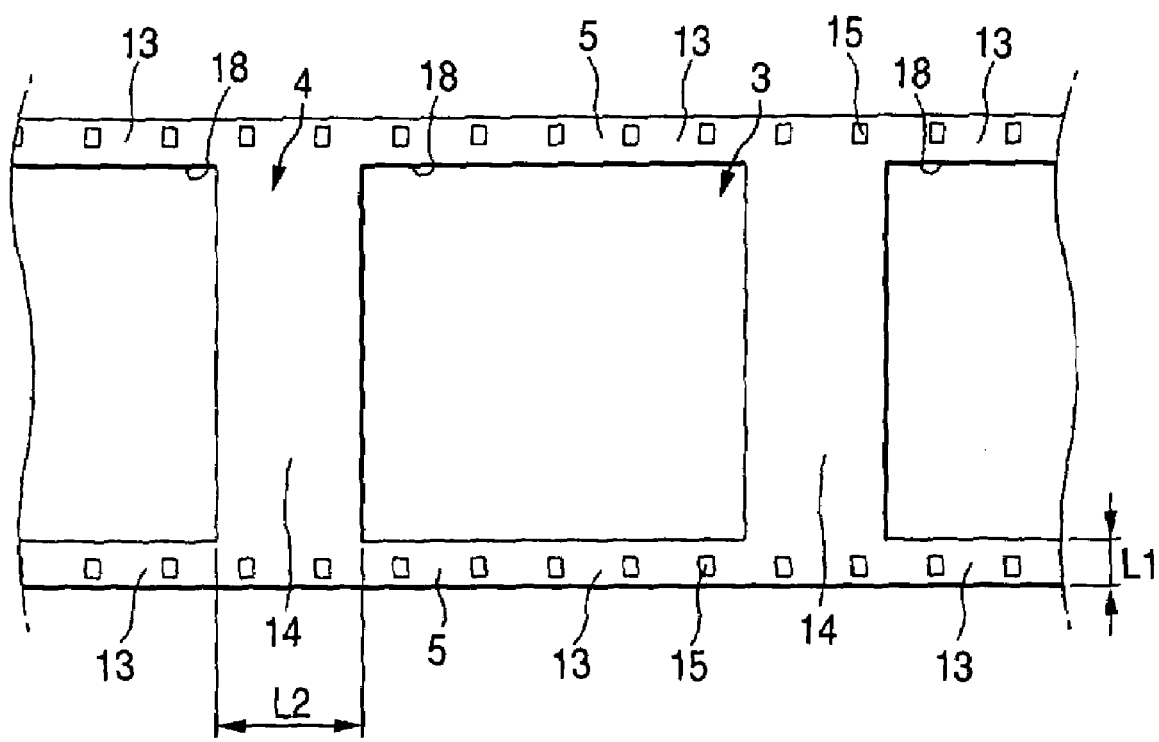
FIG. 3 is a partly bottom view of the TAB tape carrier depicted in FIG. 1.

FIG. 1 is a partly plan view showing an embodiment of a TAB tape carrier according to the invention. FIG. 2 is a partly enlarged plan view of the TAB tape carrier depicted in FIG. 1. FIG. 3 is a partly bottom view of the TAB tape carrier depicted in FIG. 1.

In FIG. 1, the TAB tape carrier 1 includes a tape-shaped insulating layer 2 extending continuously in a lengthwise direction, a plurality of mount portions 3 for mounting electronic parts (not shown), a reinforcing layer 4 (see FIG. 3) for reinforcing the insulating layer 2, and a pair of carrier portions 5 for carrying the TAB tape carrier 1.

The plurality of mount portions 3 are provided on the insulating layer 2 so as to be arranged continuously at a predetermined interval in a lengthwise direction of the insulating layer 2 (which is the same as the lengthwise direction of the TAB tape carrier 1 and may be referred simply to as lengthwise direction hereinafter). As shown in FIG. 2, each of the mount portions 3 is shaped like approximately a rectangle. An approximately rectangular mount area 6 for mounting (placing) an electronic part (not shown) is provided in the center of each mount portion 3. Electric conductor patterns 7 are formed on opposite sides respectively in the lengthwise direction of each mount area 6.

The electric conductor patterns 7 are formed on a front surface of the insulating layer 2. The electric conductor patterns 7 are made of a plurality of wires 8 arranged at a predetermined interval. Each of the wires 8 has an inner lead 9, an outer lead 10, and an intermediate lead 11 which are continuously integrated with one another.

The respective inner leads 9 face the inside of the mount areas 6 and extend along the lengthwise direction. The inner leads 9 are disposed at a predetermined interval so as to be parallel with one another in a widthwise direction of the TAB tape carrier 1 (which is a direction perpendicular to the lengthwise direction and may be referred simply to as widthwise direction hereinafter). The pitch (i.e., the sum of the width of one inner lead 9 and the width (distance) between two adjacent inner leads 9) IP between the inner leads 9 is selected to be not larger than 60 μm, preferably not larger than 50 μm and generally not smaller than 10 μm. When the pitch IP between the inner leads 9 is selected to be not larger than 60 μm in this manner, high-density wiring can be provided. Incidentally, in the TAB tape carrier 1, such high-density wiring can be achieved because flexible and high-strength stainless steel foil is used as the reinforcing layer 4 as will be described later.

The width of each inner lead 9 is selected to be in a range of from 5 μm to 50 μm, preferably in a range of from 10 μm to 40 μm. The width (distance) between two adjacent inner leads 9 is selected to be in a range of from 5 μm to 50 μm, preferably in a range of from 10 μm to 40 μm.

The respective outer leads 10 face opposite end portions in the lengthwise direction of the mount portions 3 and extend along the lengthwise direction. The outer leads 10 are disposed at a predetermined interval so as to be parallel with one another in the widthwise direction. For example, the pitch (i.e., the sum of the width of one outer lead 10 and the width (distance) between two adjacent outer leads 10) OP between the outer leads 10 is selected to be in a range of from about 100% to about 1000% as large as the pitch IP between the inner leads 9. That is, the pitch OP between the outer leads 10 may be selected to be wider than the pitch IP between the inner leads 9 or to be substantially equal to the pitch IP between the inner leads 9.

The intermediate leads 11 interlink the inner leads 9 with the outer leads 10 respectively so that the inner leads 9 are connected to the outer leads 10 respectively. The intermediate leads 11 are disposed so as to be spread radially in the lengthwise direction from the narrow-pitch inner lead 9 side to the wide-pitch outer lead 10 side.

An insulating layer 12 of a solder resist or the like is provided in areas in which the intermediate leads 11 are disposed. That is, the insulating layer 12 of a solder resist or the like is shaped like approximately rectangular frames surrounding the mount areas 6 respectively and is provided so that all the intermediate leads 11 are covered with the insulating layer 12.

Incidentally, the inner leads 9 and the outer leads 10 are preferably covered with a nickel-plating layer or a gold-plating layer suitably as will be described later.

As shown in FIG. 3, the reinforcing layer 4 is provided in all areas of a rear surface of the insulating layer 2 except positions which are opposite to the mount portions 3 so that positions where the mount portions 3 are formed on the insulating layer 2 are formed as opening portions 18. More specifically, the reinforcing layer 4 is made of stainless steel foil and formed by carrier portion-reinforcing portions 13 and mount portion gap-reinforcing portions 14 continuously integrated with the carrier portion-reinforcing portions 13, the carrier portion-reinforcing portions 13 being provided continuously along the lengthwise direction at opposite side edge portions in the widthwise direction of the TAB tape carrier 1, the mount portion gap-reinforcing portions 14 being provided along the widthwise direction in gaps between the mount portions 3 arranged at a predetermined interval in the lengthwise direction. The formation of the carrier portion-reinforcing portions 13 permits improvement of strength at the time of carrying the TAB tape carrier 1.

The formation of the mount portion gap-reinforcing portions 14 permits improvement of handling property at the time of mounting electronic parts or on other occasions.

Incidentally, the widthwise length L1 of each carrier portion-reinforcing portion 13 is selected to be, for example, in a range of from 5 mm to 15 mm, preferably in a range of from 5 mm to 10 mm whereas the lengthwise length L2 of each mount portion gap-reinforcing portion 14 is selected to be, for example, in a range of from 1 mm to 10 mm, preferably in a range of from 1 mm to 5 mm.

As shown in FIG. 1, the carrier portions 5 are provided along the lengthwise direction at opposite side edge portions in the widthwise direction of the TAB tape carrier 1. Two groups of feeding holes 15 are provided in the carrier portions 5 respectively so that the sprockets holes 15 can be engaged with sprockets or the like in order to carry the TAB tape carrier 1. The two groups of feeding holes 15 are formed so as to be opposite to each other in the widthwise direction. The feeding holes 15 are formed in the TAB tape carrier 1 so that each group of feeding holes 15 pierce the TAB tape carrier 1 (i.e., pierce the insulating layer 2 and the reinforcing layer 4) at a predetermined interval in the lengthwise direction of the TAB tape carrier 1 while each feeding hole 15 is shaped like approximately a rectangle.

Incidentally, for example, each feeding hole 15 is formed so as to be shaped like a square having a size of 1.981 mm×1.981 mm. The distance between adjacent feeding holes 15 is selected, for example, to be 4.75 mm.

A method for producing the TAB tape carrier 1 will be described below with reference to FIGS. 4 and 5.

Figure 4A:
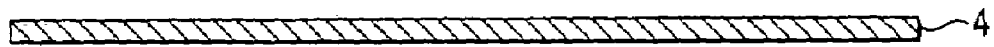
FIGS. 4A through 4D, and 5A through 5E show steps of a method for producing the TAB tape carrier according to the invention in a section taken along the line A–A' in FIG. 2.

In the method, first, a reinforcing layer 4 is prepared as shown in FIG. 4A. Stainless steel foil is used as the reinforcing layer 4. Incidentally, there are various kinds of stainless steel such as SUS301, SUS304, SUS305, SUS309, SUS310, SUS316, SUS317, SUS321, and SUS347 according to the AISI (American Iron and Steel Institute) standard. Any stainless steel can be used without any particular limitation. Preferably, stainless steel having a thickness of from 3 μm to 100 μm, particularly from 5 μm to 30 μm, more particularly from 8 μm to 20 μm is used as the stainless steel foil. In practice, along tape-shaped sheet of stainless steel foil having a width of from 100 mm to 1000 mm, preferably from about 150 mm to about 400 mm is prepared as the stainless steel foil.

Although FIGS. 4 and 5 show the form of a row of TAB tape carrier 1, rows of TAB taper carriers 1 are generally slit one by one after the rows of TAB taper carriers 1 are produced simultaneously in the widthwise direction of the stainless steel foil.

For example, four rows of 48 mm-wide TAB tape carriers 1 can be produced simultaneously on 250 mm-wide stainless steel foil, or four rows of 70 mm-wide TAB tape carriers 1 can be produced simultaneously on 300 mm-wide stainless steel foil.

Figure 4B:

Then, as shown in FIG. 4B an insulating layer 2 is formed on the reinforcing layer 4. For example, a synthetic resin such as polyimide resin, acrylic resin, polyether-nitrile resin, polyether-sulfone resin, polyethylene terephthalate resin, polyethylene naphthalate resin, or polyvinyl chloride resin is used as an electrically insulating material for forming the insulating layer 2. Preferably, polyimide resin is used as the electrically insulating material.

For example, the insulating layer 2 can be formed on the reinforcing layer 4 as follows. After a resin solution is applied on the reinforcing layer 4, the resin solution is dried and then heated to be cured. The aforementioned resin can be dissolved in an organic solvent or the like to thereby prepare the resin solution. For example, a solution of polyamic acid resin which is a precursor of polyimide is used as the resin solution. A known coating method such as a doctor blade method, or a spin coating method can be used suitably for application of the resin. After heated suitably to be dried, the resin solution is heated, for example, at a temperature of from 200° C. to 600° C. to be cured. In this manner, the insulating layer 2 made of a flexible resin film is formed on the reinforcing layer 4.

The insulating layer 2 may be also formed in such a manner that a resin formed as a film in advance is stuck onto the reinforcing layer 4 through an adhesive agent.

The insulating layer 2 maybe also formed in such a manner that a solution of a photosensitive resin such as a photosensitive polyamic acid resin is applied on the reinforcing layer 4, exposed to light and developed to form predetermined patterns.

For example, the thickness of the insulating layer 2 formed thus is not larger than 50 μm, preferably not larger than 30 μm, more preferably not larger than 15 μm and generally not smaller than 3 μm. Incidentally, in the TAB tape carrier 1, the thickness of the insulating layer 2 can be reduced as described above because flexible and high-strength stainless steel foil is used as the reinforcing layer 4.

Then, in the method, an electric conductor pattern 7 is formed as the wiring circuit pattern on a front surface of the insulating layer 2. For example, copper, nickel, gold, solder or an alloy of these materials is used as an electric conductor for forming the electric conductor pattern 7. Preferably, copper is used as the electric conductor. The formation of the electric conductor pattern 7 is not particularly limited. The electric conductor pattern 7 may be formed as the wiring circuit pattern on a front surface of the insulating layer 2 by a known patterning method such as a subtractive method, an additive method, or a semi-additive method.

The subtractive method is carried out as follows. First, an electric conductor layer is laminated on the whole front surface of the insulating layer 2 through an adhesive layer if necessary. Then, an etching resist corresponding to the wiring circuit pattern is formed on the electric conductor layer. The electric conductor layer is etched with the etching resist used as a resist. Then, the etching resist is removed.

The additive method is carried out as follows. First, a plating resist is formed as a pattern reverse to the wiring circuit pattern on the insulating layer 2. Then, an electric conductor pattern 7 is formed as the wiring circuit pattern by plating on a front surface of the insulating layer 2 except portions where the plating resist is formed. Then, the plating resist is removed.

The semi-additive method is carried out as follows. First, a thin film of an electric conductor is formed as an undercoat on the insulating layer 2. Then, a plating resist is formed as a pattern reverse to the wiring circuit pattern on the undercoat. Then, an electric conductor pattern 7 is formed as the wiring circuit pattern by plating on a front surface of the undercoat except portions where the plating resist is formed. Then, the plating resist and the undercoat on which the plating resist is laminated are removed.

Of these patterning methods, the semi-additive method is preferably used as shown in FIG. 4C to FIG. 5D.

Figure 4C:

That is, in the semi-additive method, first, as shown in FIG. 4C, a thin film of an electric conductor is formed as an undercoat 16 on the whole front surface of the insulating layer 2. A vacuum vapor deposition method, especially a sputtering vapor deposition method is preferably used for the formation of the undercoat 16. Chromium, copper, etc. is preferably used as the electric conductor for forming the undercoat 16. More specifically, for example, a chromium thin film and a copper thin film are preferably formed successively on the whole front surface of the insulating layer 2 by a sputtering vapor deposition method. Incidentally, for example, the undercoat 16 is preferably formed so that the thickness of the chromium thin film is selected to be in a range of from 100 Å to 600 Å whereas the thickness of the copper thin film is selected to be in a range of from 500 Å to 2000 Å.

Figure 4D:
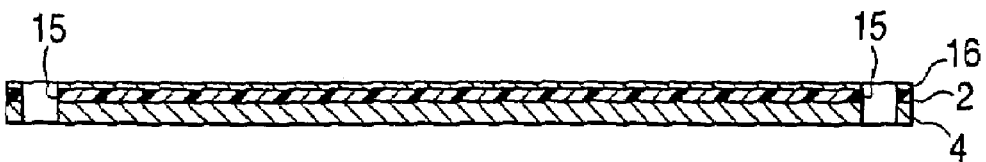

Then, in this method, as shown in FIG. 4D, the plurality of feeding holes 15 are formed at opposite side edge portions in the widthwise direction of the TAB tape carrier 1 so as to be arranged along the lengthwise direction so that each feeding hole 15 pierces the reinforcing layer 4, the insulating layer 2 and the undercoat 16 in the direction of the thickness of the TAB tape carrier 1. A known processing method such as a drilling method, a laser machining method, a punching method, or an etching method can be used for the formation of the feeding holes 15. Preferably, a punching method is used for the formation of the feeding holes 15.

Figure 5A:
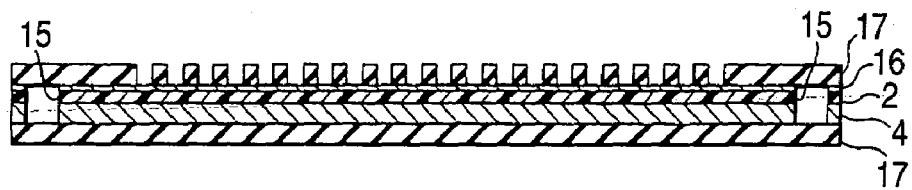

Then, in this method, as shown in FIG. 5A, a plating resist 17 is formed as a pattern reverse to the wiring circuit pattern on the undercoat 16. The plating resist 17 can be formed as a predetermined resist pattern by a known method, for example, using a dry film resist. Incidentally, the plating resist 17 is also formed on the whole front surface of the reinforcing layer 4.

Figure 5B:
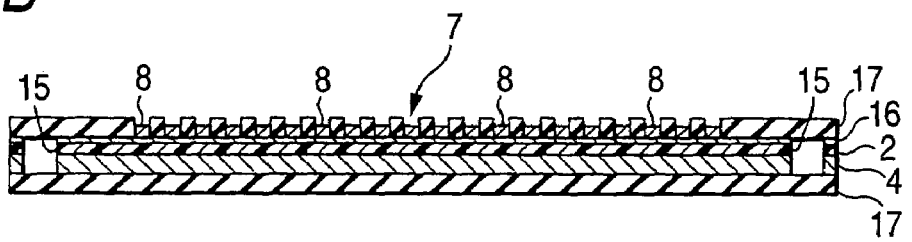

Then, as shown in FIG. 5B, an electric conductor pattern 7 is formed as the wiring circuit pattern by plating on a surface of the undercoat 16 except portions where the plating resist 17 is formed. Either electroplating or electroless plating maybe used as the plating. Preferably, electroplating is used. Especially, copper electroplating is preferably used.

Figure 5C:
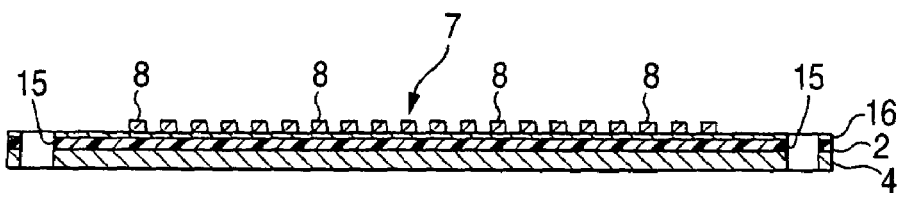
Figure 5D:
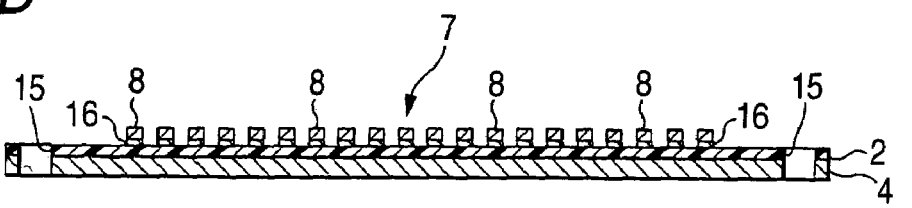

Then, as shown in FIG. 5C, the plating resist 17 is removed by a known etching method such as chemical etching (wet etching) or by peeling. Then, as shown in FIG. 5D, the undercoat 16 on which the plating resist 17 was formed is removed by a known etching method such as chemical etching (wet etching) in the same manner as described above. As a result, the electric conductor pattern 7 is formed on the insulating layer 2 so that the electric conductor pattern 7 is provided as a wiring circuit pattern of wires 8 each having an inner lead 9, an outer lead 10 and an intermediate lead 11 continuously integrated with one another as described above.

For example, the thickness of the electric conductor pattern 7 formed thus is in a range of from 3 μm to 50 μm, preferably in a range of from 5 μm to 25 μm.

Then, a not-shown insulating layer 12 made of a solder resist or the like is formed to enclose the mount areas 6 so that the intermediate lead 11 of each wire 8 is covered with the insulating layer 12. Then, exposed portions of each wire 8, that is, the inner lead 9 and the outer lead 10 in each wire 8 are covered with a nickel plating layer and a gold plating layer. For example, the insulating layer 12 can be formed as the aforementioned pattern by use of a photosensitive solder resist. The nickel plating layer and the gold plating layer can be formed by nickel plating and gold plating respectively.

Figure 5E:
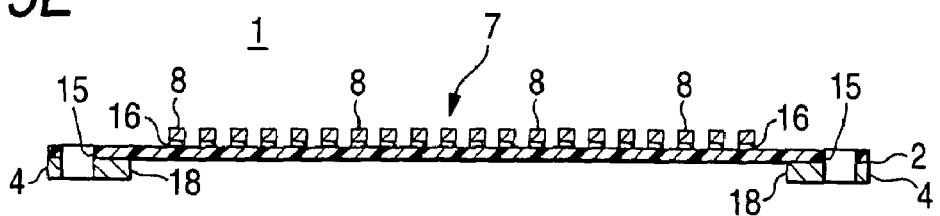

Then, as shown in FIG. 5E, opening portions 18 are formed in the reinforcing layer 4 in positions where the reinforcing layer 4 overlaps the mount portions 3. Thus, the TAB tape carrier 1 is obtained.

Incidentally, when rows of TAB tape carriers 1 are produced simultaneously in the widthwise direction of the reinforcing layer 4 and then slit one by one, portions of the reinforcing layer 4 corresponding to the slit portions between adjacent rows of the TAB tape carriers 1 are preferably removed in the same manner as the opening portions 18.

The opening portions 18 can be formed in the reinforcing layer 4 in such a manner that portions of the reinforcing layer 4 opposite to the mount portions 3 are opened by a known method such as drilling, punching, or wet etching (chemical etching) For example, formation of the opening portions 18 in the reinforcing layer 4 by etching can be carried out as follows. Portions of the reinforcing layer 4 except the opening portions 18 are covered with an etching resist. Then, the reinforcing layer 4 is etched with a known etching solution such as a ferric chloride solution. Then, the etching resist is removed. After the etching, the rows of TAB tape carriers 1 are slit one by one if the rows of TAB tape carriers 1 are produced simultaneously in the widthwise direction of the reinforcing layer 4.

Since the reinforcing layer 4 of stainless steel foil more flexible and having a higher strength than copper foil is formed on a rear surface of the insulating layer 2 in the TAB tape carrier 1 obtained thus, the strength of the TAB tape carrier 1 can be enhanced sufficiently at the time of carrying the TAB tape carrier or at the time of mounting and bonding electronic parts while the insulating layer 2 can be formed thinly. Accordingly, both dimensional accuracy and positional accuracy can be improved at the time of carrying the TAB tape carrier or at the time of mounting and bonding electronic parts. While reduction in weight, thickness and size can be attained, electronic parts can be mounted surely in such high-density wiring that the pitch between the inner leads 9 in the electric conductor pattern 7 is not larger than 60 µm.

Although the above description has been made upon the case where the reinforcing layer 4 is provided on the whole area of the rear surface of the insulating layer 2 except positions opposite to the mount portions 3, the positions where the reinforcing layer 4 is provided are not particularly limited and can be selected suitably according to the purpose and usage. For example, the reinforcing layer 4 maybe provided in positions opposite to the mount portions 3 so that heat-radiating characteristic can be improved.

EXAMPLE

The invention will be described below more specifically on the basis of the following example and comparative example.

Example 1

Stainless steel foil (SUS304, 250 mm wide) 20 µm thick was prepared as a reinforcing layer (see FIG. 4A). A solution of a polyamic acid resin was applied on the reinforcing layer, dried and heated to be cured to thereby form an insulating layer of a polyimide resin 12 µm thick (see FIG. 4B). Then, a chromium thin film and a copper thin film were formed successively on a front surface of the insulating layer by a sputtering vapor deposition method to thereby form an undercoat 2000 Å thick (see FIG. 4C).

Although FIGS. 4A and 5E show the form of one row of TAB tape carrier, Example 1 shows the case where four rows of 48 mm-wide TAB tape carriers are produced simultaneously on 250 mm-wide stainless steel foil.

Then, feeding holes were formed by punching so that each feeding hole pierced the reinforcing layer, the insulating layer and the undercoat in the direction of the thickness of the TAB tape carrier (see FIG. 4D). Then, a plating resist was formed as a predetermined pattern on a surface of the undercoat and formed on the whole front surface of the reinforcing layer (see FIG. 5A).

Then, the resulting sheet was immersed in an electrolytic copper sulfate plating solution so that portions of the undercoat except portions where the plating resist was formed were electroplated with copper at the rate of $2.5$ $A/dm^2$ for about 20 minutes to thereby form an electric conductor pattern 10 µm thick (see FIG. 5B).

Incidentally, the electric conductor pattern was formed as a plurality of wiring patterns arranged at a predetermined interval and each having an inner lead, an outer lead and an intermediate lead continuously integrated with one another. The pitch between the inner leads was 30 µm whereas the pitch between the outer leads was 100 µm.

Then, the plating resist was removed by chemical etching (see FIG. 5C). Then, the undercoat on which the plating resist had been formed was removed by chemical etching in the same manner as described above (see Step FIG. 5D).

Then, a photosensitive solder resist was formed to enclose the mount areas so that the intermediate lead of each wire was covered with the photosensitive solder resist. Then, the inner leads and the outer leads were covered by nickel plating and gold plating.

Then, portions of the reinforcing layer except positions overlapping the mount portions were covered with an etching resist. Then, the reinforcing layer was etched with a ferric chloride solution to thereby form opening portions and slit portions between TAB tape carriers. Then, the etching resist was removed and slit to thereby obtain TAB tape carriers.

Comparative Example 1

TAB taper carriers were obtained in the same manner as in Example 1 except that copper foil 20 µm thick was used as the reinforcing layer.

(Evaluation)

In each of the TAB tape carriers obtained in Example 1 and Comparative Example 1, the distance between two inner leads located at opposite ends in the widthwise direction (i.e., the distance between the widthwise centers of inner leads located at opposite ends as represented by the sign "X" in FIG. 2) was measured and compared with a design size. Results of the measurement were as follows. Incidentally, the measured value was an average of values measured 20 times.

Design Size: 21000 µm

Example 1: 21002 µm, dimensional difference of 2 µm

Comparative Example 1: 21020 µm, dimensional difference of 20 µm

As described above, in the TAB tape carrier according to the invention, the reinforcing layer of stainless steel foil which is more flexible and has a higher strength than copper foil is formed on a rear surface of the insulating layer. Accordingly, while the insulating layer can be formed thinly, both dimensional accuracy and positional accuracy can be improved at the time of carrying the TAB tape carrier or at the time of mounting and bonding electronic parts. Accordingly, while reduction in weight, thickness and size can be attained, electronic parts can be mounted surely in such high-density wiring that the pitch between wires in the electric conductor pattern is not larger than 60 µm.

The present application is based on Japanese Patent Application No. 2002-294787, the entire contents of which are incorporated herein by reference.

What is claimed is:

1. A tape carrier comprising:
   an insulating layer;
   electric conductor patterns formed on a front surface of said insulating layer and each made of a plurality of wires arranged at a predetermined interval; and
   a reinforcing layer of stainless steel foil formed on a rear surface of said insulating layer so as to be provided along a lengthwise direction of said insulating layer at opposite side edge portions in a widthwise direction of said insulating layer.

2. A tape carrier according to claim 1, wherein said wires are arranged with a pitch of not larger than 60 μm.

3. A tape carrier according to claim 1, wherein said insulating layer has a thickness of not larger than 50 μm.

4. A tape carrier according to claim 1, wherein feeding holes formed along a lengthwise direction of the tape carrier at opposite end portions in a widthwise direction of the tape carrier.

* * * * *